United States Patent
Kishikawa et al.

(10) Patent No.: US 7,771,093 B2
(45) Date of Patent: Aug. 10, 2010

(54) LIGHT EMITTING DEVICE

(75) Inventors: Daisuke Kishikawa, Tokushima (JP);
Keisuke Tokuda, Tokushima (JP);
Naoki Nishiuchi, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 11/834,146

(22) Filed: Aug. 6, 2007

(65) Prior Publication Data

US 2008/0180959 A1    Jul. 31, 2008

(30) Foreign Application Priority Data

Sep. 8, 2006  (JP) ............... 2006-244839
Jun. 15, 2007 (JP) ............... 2007-158163

(51) Int. Cl.
*F21V 3/00* (2006.01)
(52) U.S. Cl. .................. 362/363; 362/296.07; 362/365
(58) Field of Classification Search ................. 362/296, 362/362–365; 257/98–100
See application file for complete search history.

(56) References Cited

U.S. PATENT DOCUMENTS 6,828,170 B2* 12/2004 Roberts et al. ............... 438/27
7,190,003 B2* 3/2007 Isoda .......................... 257/98
2003/0107316 A1   6/2003 Murakami et al.
2006/0054912 A1   3/2006 Murakami et al.
2009/0140630 A1* 6/2009 Kijima et al. ............... 313/498

FOREIGN PATENT DOCUMENTS

| CN | 1423347 A | 6/2003 |
| JP | H08-293626 A | 11/1996 |
| JP | H10-150127 A | 6/1998 |
| JP | H11-345912 A | 12/1999 |
| JP | 2002-329892 A | 11/2002 |
| JP | 2003-174200 A | 6/2003 |
| JP | 2004-179430 A | 6/2004 |

* cited by examiner

*Primary Examiner*—John A Ward
(74) *Attorney, Agent, or Firm*—Global IP Counselors, LLP (57) ABSTRACT

A light emitting device comprises a first metal member, a light emitting element mounted at one end of the first metal member, and a translucent covering material that covers at least the light emitting element, wherein the surface of the first metal member has a depression that determines the region where the translucent covering material is formed, and the inner wall of the depression is continuous.

14 Claims, 7 Drawing Sheets

LIGHT EMITTING DEVICE

BACKGROUND OF THE INVENTION

1. Field of the Invention

The present invention relates to a light emitting device, and more particularly relates to a light emitting device in which a light emitting element is mounted on a metal member, and parts of the light emitting element and the metal member are embedded in a package.

2. Background Information

There are light emitting devices that make use of a semiconductor and a translucent covering material that covers the semiconductor, and in recent years there has been a need for light emitting devices with less variance in their characteristics.

Figure 4:
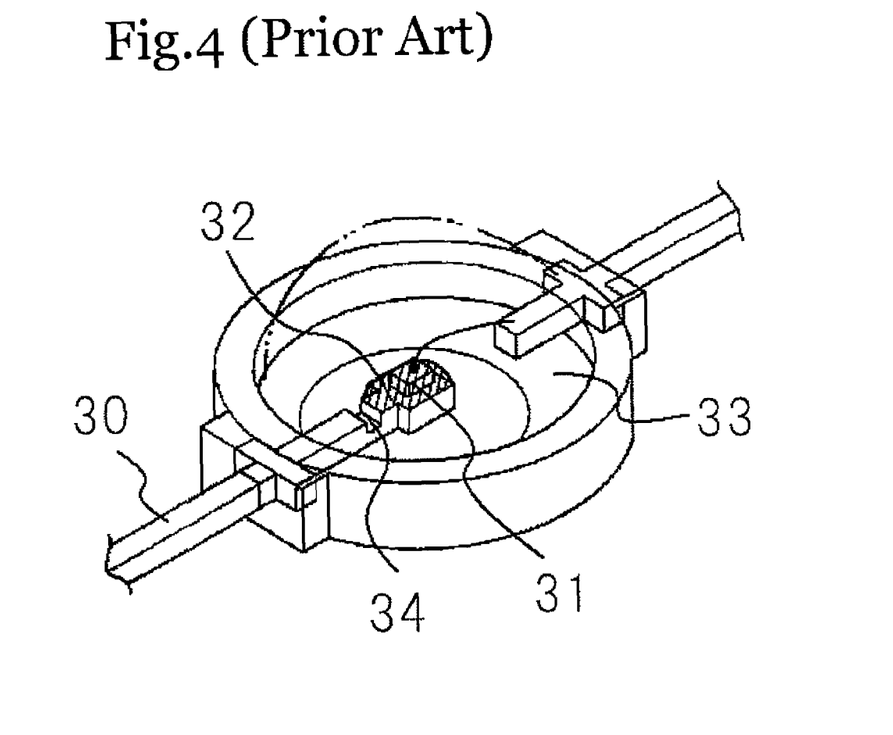
FIG. 4 is an oblique view of a conventional light emitting diode.

An example of this is shown in FIG. 4, which shows a proposed semiconductor device in which part of a lead frame 30 is coated with a silicon resin layer 32 so as to cover the surface of a semiconductor element 31 affixed to the lead frame 30, and the semiconductor element 31, including this silicon resin layer 32, and part of the lead frame 30 are covered with a sealing resin layer 33, wherein a groove 34 for preventing out-flow of the silicon resin is formed in a portion of the lead frame 30 corresponding to the peripheral edge of the silicon resin layer 32 (Japanese Laid-Open Patent Application H8-293626, for example).

The effect of forming this groove for preventing resin outflow is that the spreading flow of the silicon resin is dammed when the semiconductor element surface is coated with the silicon resin, and this prevents the silicon resin from flowing out over the lead frame. Thus, the semiconductor element is reliably covered with a silicon resin layer, the shape thereof is stabilized, and there is less variance in the characteristics of individual products.

With a light emitting device such as this, however, because the groove for preventing resin out-flow extends all the way to the end of the lead frame, when resin flows into the groove, the resin may flow out from the ends of the groove, and the shape thereof may not be sufficiently stabilized.

SUMMARY OF THE INVENTION

The present invention has taken the aforementioned problems into consideration, and will provide a light emitting device of high quality to be obtained at a high yield by preventing the out-flow of the translucent covering material that covers/embeds the periphery of a light emitting element, which allows the translucent covering material to be reliably disposed in the proper location, and keeps quality variance to a minimum.

The present invention provides a light emitting device, comprising a first metal member, a light emitting element mounted at one end of the first metal member, and a translucent covering material that covers at least the light emitting element, wherein the surface of the first metal member has a depression that determines the region where the translucent covering material is formed, and the inner wall of the depression is continuous.

According to the light emitting device of the present invention, a depression effectively dams and prevents the out-flow of the translucent covering material that covers/embeds the periphery of a light emitting element, so the translucent covering material can be prevented from spreading and flowing out. That is the translucent covering material can be prevented from running down from the metal member. This allows the translucent covering material to be reliably disposed in the proper location, keeps quality variance to a minimum, and allows a light emitting device of high quality to be obtained at a high yield.

The light emitting device of the present invention can be utilized in illumination light sources, various indicators, vehicle lamps, display light sources, backlight light sources for LCD, traffic signal, vehicle portions, channel letter for billboard and various other types of illuminating apparatus.

DETAILED DESCRIPTION OF THE PREFERRED EMBODIMENTS

The light emitting device of the present invention mainly comprises a light emitting element, at least a first metal member, and a translucent covering material.

Light Emitting Element

The light emitting elements are generally semiconductor light emitting elements, especially, any semiconductor light emitting elements may be used so long as they are elements called light emitting diodes. For example, it includes a laminated structure that contains an active layer on a substrate, which is made of nitride semiconductors such as InN, AlN, GaN, InGaN, AlGaN, and InGaAlN, and compound semiconductors of a group III-V elements, II-VI elements, and the like.

Examples of substrates include insulating substrates, such as spinel ($MgAl_2O_4$) or sapphire whose main plane is either a C plane, A plane, or R plane; silicon carbide (6H, 4H, 3C), silicon, ZnS, ZnO, GaAs, or diamond; oxide substrates such as lithium niobate or neodymium gallate; and nitride semiconductor substrates such as GaN and AlN.

The structures of semiconductor includes homostructures having MIS junctions, PIN junctions, or PN junctions or the like, heterostructures, and double heterostructures. Furthermore, a multilayer laminate structure or an ultra lattice structure are also acceptable, as are a single quantum well structure or a multiquantum well structure laminated as a thin film which generates quantum effects.

The active layer may contain a donor impurity such as Si, Ge, or the like, and acceptor impurity such as An, Mg, or the like.

A wave length of the obtained light emitting element may be changed from ultraviolet to red region depending on a material of the semiconductor, a mixed crystal rate, indium content of the active layer such as InGaN, kind of the impurity doped in the active layer.

The light emitting element is mounted on the metal member (discussed below), and a joining material is used for this purpose. For instance, in the case of light emitting element formed by growing a nitride semiconductor on a sapphire substrate, that emit blue and green light, an epoxy resin, silicone, or the like can be used. When degradation due to light or heat from the light emitting element is taken into account, the back side of the light emitting element may be plated with aluminum, or instead of using a resin, a solder such as eutectic Au—Sn, or a brazing material such as a low-melting point metal may be used. In the case of a light emitting element with electrodes formed on both sides, such as a light emitting element that is formed by GaAs, or the like and emits red light, die bonding may be performed using a conductive paste made of silver, gold, palladium, or the like.

With the light emitting device of the present invention, just one light emitting element may be mounted, but two or more may be mounted.

First Metal Member

The first metal member is usually electrically connected to the light emitting element and, optionally, a protective element, and generally has the function of a lead electrode. It is also used to mount the light emitting element and, optionally, a protective element. Since part of the metal member is usually embedded in the package, the portion that functions as a lead electrode and a platform for mounting the light emitting element, etc., is also called an internal terminal, and the portion that extends outside the package and has the function of making an electrical connection with an outside is also called an external terminal. There are no particular restrictions on the material as long as it can function as described above, but forming the metal members from a material with a relatively high thermal conductivity is preferable. Forming from such a material allows the heat generated by the light emitting elements to escape more efficiently. For example, it is preferable to use a material that has a thermal conductivity of about 200 W/(m·K) or higher, or one with a relatively high mechanical strength, or one that lends itself well to punching, etching, or other such working. More specifically, examples include copper, aluminum, gold, silver, tungsten, iron, nickel, and other such metals, and alloys such as iron-nickel phosphor bronze, iron-containing copper, and the like, or materials which are plated with silver, aluminum, copper, gold and other such metals thereon. The surface of the metal member is preferably smooth in order to increase reflectivity. The metal member is usually formed at a uniform thickness, but it may have partially a thick portion or a thin portion.

There are no particular restrictions on the shape of the metal member, which can be suitably determined by taking into account the number of light emitting elements, their layout, the space available for this layout, and so forth. For example, the place where the light emitting element is mounted at an internal terminal of the first metal member may be flat, or a concave portion may be formed for mounting the light emitting element. Forming a concave portion ensures the proper disposition of the light emitting element, and also stabilizes the covering of the translucent covering material and ensures that resin sag will be prevented. This concave portion is preferably opposed to a second metal member that forms a pair with the first metal member. As a result, when the light emitting element is mounted in the concave portion, the wiring will be shorter between the light emitting element and the second metal member, and this prevents wire breakage and so forth.

The concave portion may have a bottom surface area at least large enough for the light emitting element to be mounted, and can be circular or elliptical, a shape that is polyhedral with rounded corners, or a modified shape that is based on these. The depth is, for example, at least equal to the height of the light emitting element, and may be about 0.1 mm or greater, and preferably no more than about 0.5 mm. The side faces may be vertical, but are preferably slanted so that the width decreases toward the bottom. For example, a suitable shape is one in which the sides slope at about 0 to 45°, and preferably about 20 to 40°, in the normal direction with respect to the bottom face. This allows light from the light emitting element to be guided to the top face more efficiently.

A plane face is preferably disposed surrounding the outer periphery of the concave portion. Providing a plane face around the outer periphery of the concave portion effectively prevents running and so forth of the translucent covering material embedded in the concave portion (discussed below). This also makes it easier to form the concave portion. Furthermore, it is possible to ensure a region for mounting a protective element, etc. (discussed below).

The plane face is usually disposed at a different height from that of the bottom face of the concave portion, and the surface thereof is preferably rounded from the side face of the concave portion to the top of the plane face. This rounding makes it less likely that cracks will occur in the package or the translucent covering material at the upper edge of the opening of the concave portion, and prevents the separation of the translucent covering material and the package.

There are no particular restrictions on the shape of the plane face surrounding the outer periphery of the concave portion (the shape in plan view), but as an example, a part thereof can be similar to the shape of the adjacent concave portion (that is, the same or substantially the same shape, or a corresponding shape), and this is usually circular or elliptical, a shape that is polyhedral with rounded corners, or a modified shape that is based on these, having a diameter of about 2 to 5 mm. This allows the translucent covering material covering the light emitting element to be formed stably in a shape that follows the outer periphery of the concave portion. In order for at least part of the plane face to be linked with a region that functions as a so-called inner terminal and/or outer terminal, the plane face does not necessarily have to be a shape that corresponds to the shape of the concave portion all the way around the outer periphery of the concave portion. The width of the plane face, from the outer periphery of the concave portion, is preferably about 0.3 to 1.5 mm, for example.

In the surface of the plane face is formed a depression that determines the formation of the translucent covering material. The depression may be one that will exert surface tension on the translucent covering material and prevent the material from flowing out. Also, the entire inner wall of the depression is formed continuously. That is, both ends of the depression are disposed to the inside from the ends of the first metal member (see 16a in FIG. 2A). Also, this depression is disposed around the outer periphery of the concave portion, so when the translucent covering material is applied positioned) by potting, for instance, even if the surface tension of the translucent covering material is inadequate, and the material overflows from the concave portion and spreads to the surrounding area, the translucent covering material can still be effectively held back by the depression. Also, when the ends of the depression are disposed further to the inside than the ends of the first metal member, the height difference at the ends of the depression between the depression and the plane face that is not a depression reliably dams up the translucent covering material. Therefore, the translucent covering material can be reliably prevented from running down from the first metal member. Accordingly, it is effective for the ends of the depression to be disposed about 0.1 to 0.4 mm further to the inside than the ends of the first metal member.

There are no particular restrictions on the planar shape, disposition, line thickness, depth (height), and so forth of the depression, which can be suitably adjusted according to the size of the light emitting device, the type of translucent covering material being used, and other such factors. For example, the depression may have a planar shape and disposition such that the surface tension of the translucent covering material will come into play, or in other words, so that the translucent covering material will surround the entire outer periphery of the concave portion and have a shape that is close to circular, or the depression may be disposed so as to surround part of the outer periphery of the concave portion. Also, the depression may be disposed on the second metal member side, or on the terminal side of the first metal member. Furthermore, a single depression may be disposed continuously, or two or more may be disposed intermittently. Also, the shape of the depression does not necessarily have to correspond to the outer peripheral shape of the concave portion, and may be rounded or may have one or more corners (see 16 in FIG. 2A, for example). Put another way, the depression preferably conforms to the plan view shape of the concave portion, and more specifically, when the plan view of the concave portion is circular, the plan view of the depression may be a bent line shape that conforms to this circular shape, but is preferably circular, elliptical, or a shape similar to these. Also, when the depression is in the form of a bent line, a region can be ensured for mounting a protective element on the plane face of the first metal member. Also, a plurality of depressions may be formed as dots or a broken line. In this case, surface tension will also act on the surface of the first metal member between the parts of the depression, so more of the translucent covering material can be supported on the surface of the first metal member, and the translucent covering material can be prevented more effectively from running down from the first metal member. Furthermore, the depression may be disposed as a plurality of rows or in a radial pattern. In this case, the volume of the depression holding the translucent covering material will be greater, and this further helps prevent out-flow.

The distance of the depression from the concave portion is preferably shorter, and is, for example, about 0.1 to 1.0 mm. There are no particular restrictions on the line thickness of the depression, but an example is about 0.05 to 0.3 mm. The depth (height) can be suitably adjusted according to the material, thickness, and so forth of the metal member being used, and about 0.05 to 0.2 mm, for example, is preferable. The bottom (or top) face of the depression may be flat, or in may be tapered, round, or any of various other shapes. Also, the depression may be formed by bending or drawing the metal member, or may be formed by using a laser, dicing saw, or the like to thinly shave away the thickness of the metal member at that portion.

The first metal member preferably has a shape that extends, as an external terminal, in a different direction from the concave portion and the plane face. The second metal member preferably is disposed, as an internal terminal, so as to be opposed to the plane face and the concave portion of the first metal member, and that extends, as an external terminal, in a specific direction. There are no particular restrictions on the direction in which the metal members extend, which can be suitably adjusted by taking into account the type of mounting (such as through-hole type or snap mounting type). These metal members do not need to protrude to the outside from the same face of the package, and may protrude to the outside from a plurality of different faces. For instance, the distal ends (that is, the external terminals) of all the metal members may protrude in the bottom face direction of the light emitting device (see FIG. 2B), or may protrude in the side face direction, or may be bent in the side face direction or the bottom face direction (outside the light emitting element), to create a light emitting device of any surface mount type.

Figure 1:
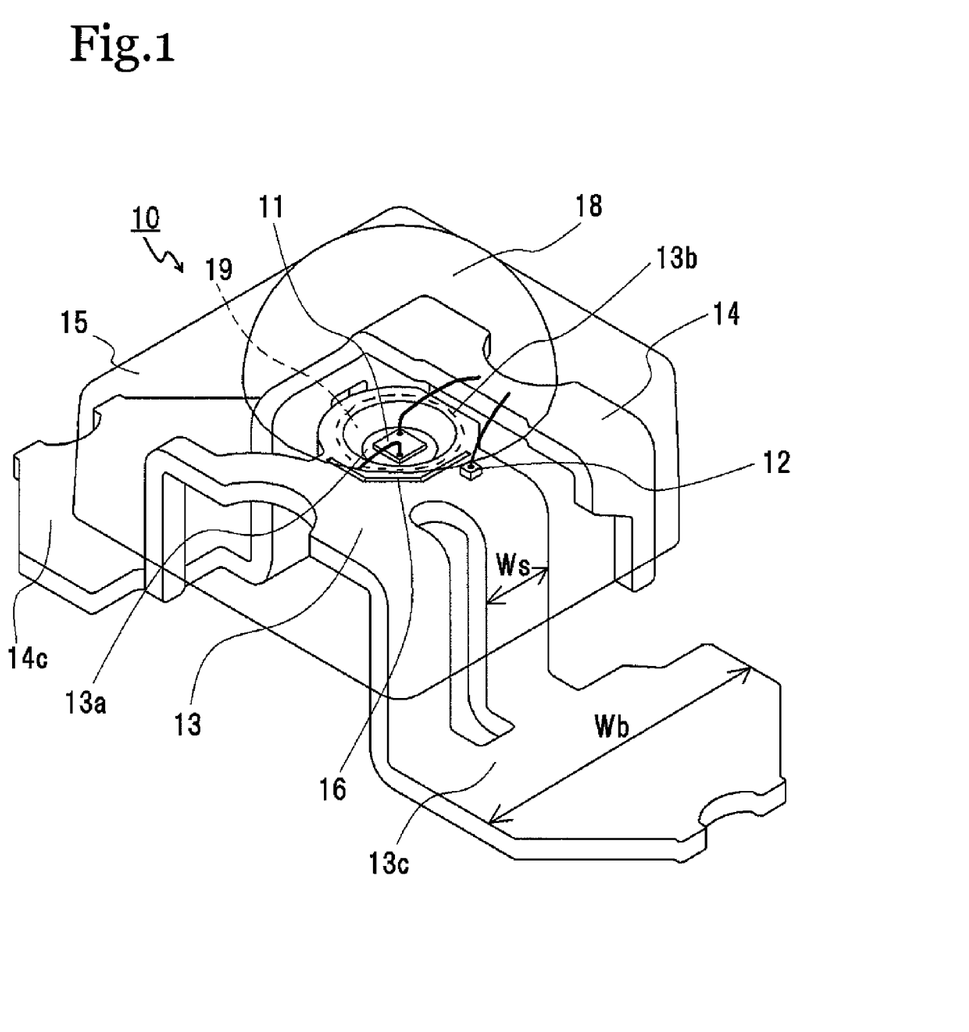
FIG. 1 is an oblique view of an embodiment of the light emitting device of the present invention.

Also, the metal members are preferably formed so that the width of their distal ends (see Wb in FIG. 1) is greater than their width at the side face of the light emitting device (that is, the width of the portion protruding toward the bottom face; see Ws in FIG. 1). The width Wb of the wider region is, for example, about 1.2 to 6 times the width Ws at the side face. Thus bending and/or widening the metal members allows mounting to a mounting substrate with solder, or by a solder-free method such as crimping. In particular, widening the distal end portion allows heat generated by the light emitting element to be effectively dispersed to outside the package, and this affords better device performance.

At least two metal members which are first and second metal members may be provided to a single light emitting device, and it is good for their to be one more metal member than there are light emitting elements, or for there to be at least twice as many metal members as light emitting elements. For instance, if just one light emitting element is used, the light emitting element is mounted on one of the metal members, an electrical connection is made with one of the electrodes of the light emitting element, and the other metal member is electrically connected with the other electrode of the light emitting element.

When two or more light emitting elements are used, some or all of the light emitting elements may be mounted on a single metal member and electrically connected, and other metal members may be electrically connected to each of the light emitting elements. For example, each light emitting element may be mounted on and electrically connected to a separate metal member, and other metal members may be electrically connected to each of the light emitting elements. Thus mounting a plurality of light emitting elements and using independent wiring so that one metal member is electrically connected to each of these makes it possible to select from among various wiring patterns, such as serial or parallel, and affords greater design freedom in the mounting of the light emitting device. Also, when independent wiring is used, it is easier to adjust the emission intensity of the mounted light emitting elements, so this is particularly advantageous when using a plurality of light emitting elements that emit light of different colors, such as a full-color LED. In addition, the heat dissipation paths of the various light emitting elements can be formed without overlapping, so the heat generated from the light emitting elements can be dissipated more evenly, resulting in better heat radiation.

Also, the metal member may be one that is not electrically connected to the light emitting element and is only used to mount the light emitting element, or is not used to mount the light emitting element. A metal member such as this can function as a heat dissipation path for guiding heat generated from the light emitting element to the outside, and as a means for preventing overvoltage.

The metal members are usually electrically connected to the light emitting element, and to the protective element if needed, by wire bonding. The wire preferably has good ohmic characteristics with the electrodes of the light emitting elements, or has good mechanical connection characteristics, or has good electrical conductivity and thermal conductivity. The thermal conductivity is preferably about 0.01 cal/S·cm$^2$·°C./cm or higher, and about 0.5 cal/S·cm$^2$·°C./cm or higher is even better. When ease of work and so forth are taken into account, the diameter of the wire is preferably about 10 to 45 µm. Examples of this wire include gold, copper, platinum, aluminum, and other such metals and alloys thereof. The wire can be easily connected to the light emitting elements and the wire bonding metal member by using a wire bonding machine.

Translucent Covering Material

The translucent covering material is embedded in the concave portion of the first metal member after the light emitting element has been placed in the concave portion of the first metal member and an electrical connection has been obtained between the first and second metal members and the light emitting element by wire bonding or the like as discussed above. The translucent covering material is usually heaped up higher than the plane face of the first metal member from inside the concave portion of the first metal member. The translucent covering material protects the light emitting element against external force, moisture, and so forth, and also protects the wiring. Embedding the translucent covering material in the concave portion of the first metal member prevents the package from being deteriorated by light and heat, and utilizing a translucent covering material also allows light of various colors and brightness to be taken off.

Examples of this translucent covering material include epoxy resin, silicone, acrylic resin, urea resin, and other transparent resins, glass, and so forth with excellent weather resistance. The translucent covering material may be the same as the package, but may instead be a different material or have a different composition, etc. In particular, even if moisture should be admixed into the translucent covering material during manufacture or storage, any moisture contained in the transparent resin can be released to the outside by baking for at least 14 hours at 100° C. Therefore, it is possible to prevent separation between the light emitting element and the package discussed below, and steam explosion. It is preferable to select materials of the translucent covering material with little different in their coefficients of thermal expansion, taking into account factors such as adhesion between the translucent covering material and the package that has been subjected to the effects of heat produced from the light emitting elements and so forth.

In the present invention, the term "translucent" means that the material transmits at least about 70%, and preferably at least about 80%, and more preferably at least about 90%, and even more preferably at least about 95%, of the light emitted from the light emitting element.

The translucent covering material may contain a diffuser or a fluorescent substance. A diffuser is an agent that diffuses light, and serves to lessen directionality from the light emitting element and to widen the viewing angle. A fluorescent substance is one that converts light from the light emitting element, and is able to convert the wavelength of light emitted from the light emitting element to the outside of the package. If the light from the light emitting element is visible light with a short wavelength and high energy, then it is preferable to use an inorganic fluorescent substance such as ZnCdS:Cu, YAG:Ce, or nitrogen-containing $CaO—Al_2O_3—SiO_2$ that has been activated with europium and/or chromium, or a perylene derivative, which is an organic fluorescent substance. With the present invention, when white light is to be obtained, particularly when a YAG-Ce fluorescent substance is used, depending on the content thereof, it is possible to emit yellow light that absorbs part of, and is a complement to, the light from a blue light emitting element, and white light can be formed relatively simply and with good reliability. Similarly, when nitrogen-containing $CaO—Al_2O_3—SiO_2$ that has been activated with europium and/or chromium is used, depending on the content thereof, it is possible to emit red light that absorbs part of, and is a complement to, the light from a blue light emitting element, and white light can be formed relatively simply and with good reliability. Besides these fluorescent substances, any of the known fluorescent substance, for example, described in Japanese Patent Laid-Open No. 2005-19646, Japanese Patent Laid-Open No. 2005-8844, etc. can be used.

When a fluorescent substance is used, disposing the translucent covering material at a suitably location will prevent a decrease in light take-off efficiency, with no leakage of light. Furthermore, color unevenness can be suppressed.

Package

The package may be formed from any material as long as it can integrally embed part of the above-mentioned metal member and seal it in the form of a block, and can ensure insulation of the light emitting elements and the metal member. For instance, specific examples of which include polyphthalamide (PPA), polycarbonate resin, polyphenylene sulfide (PPS), liquid crystal polymer (LCP), ABS resin, epoxy resin, phenol resin, acrylic resin, PBT resin, and other such resins, and ceramics. Among these, translucent resin is preferable. Various kinds of dye, pigment, or the like may be mixed into these materials as colorants or light diffusers. Examples of colorants include $Cr_2O_3$, $MnO_2$, $Fe_2O_3$, and carbon black, and examples of light diffusers include calcium carbonate, aluminum oxide, and titanium oxide.

There are no particular restrictions on the size and shape of the package, but examples of the shape include a circular column, elliptical column, spherical, egg shaped, triangular column, tetragonal column, polygonal column, and shapes similar to these. The package may also be integrally molded with a lens for converging.

The light emitting device of the present invention can usually be integrally molded itself, by first placing the light emitting element and protective element on the first metal member, then inserting the first and second metal members into a resin casting case filled with a package material, and curing.

Protective Element

There are no particular restrictions on the protective element, and any known type that is mounted in light emitting devices may be used. Examples of protective elements include elements that short-circuit reverse voltage applied to the light emitting element, or that short-circuit forward voltage of at least a specific voltage that is higher than the operating voltage of the light emitting element, that is, elements that protect against overheating, over-voltage, over-current, and static electricity, and circuit protection elements. More specifically, a zener diode, transistor diode, or the like can be used.

With the light emitting device of the present invention, the protective element is preferably placed on the first metal member, at a location opposite the light emitting element, with the depression therebetween. This prevents the fluid material (e.g., die-bonding material, etc.) of the protective element from flow out toward the concave portion. Usually just one protective element is used, but two or more may be used. Also, the present invention is preferably placed on the first metal member (the metal member where the light emitting element is installed), but may instead be placed on the second metal member.

Other Components

The light emitting device may be equipped with a lens or the like made of plastic or glass, at the portion where the light of the light emitting element is emitted (such as the package portion above the light emitting element), for example, as an internal part of the package, or as an accessory on the package surface. The shape of the lens can be suitably adjusted according to the shape of the light configuration. To allow light to be taken off more efficiently from the light emitting element, the light emitting device may also be equipped with a reflecting member, anti-reflection member, light diffusion member, or any of various other components.

Examples of the light emitting device of the present invention will now be described in detail through reference to the drawings.

Example 1

Figure 2A:
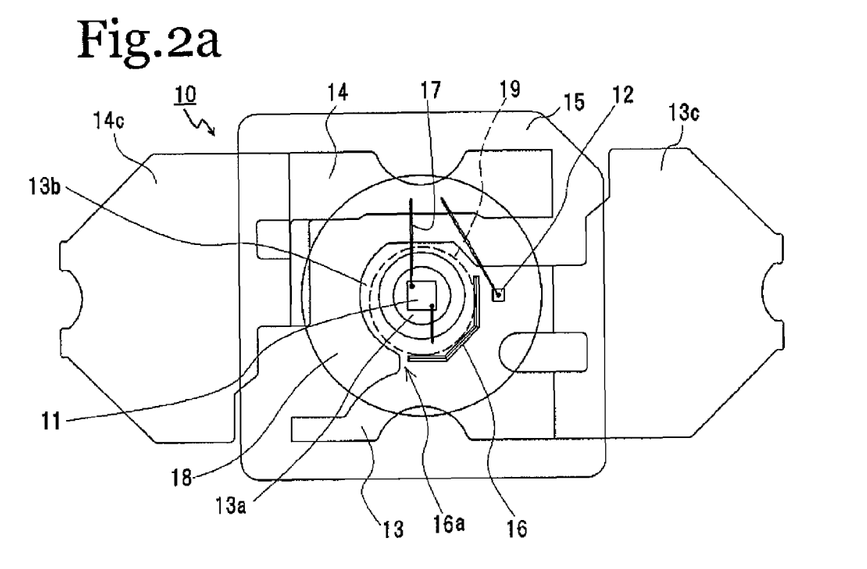
FIGS. 2a and 2b are a plan view and a side view of the embodiment of the light emitting device of FIG. 1.
Figure 2B:
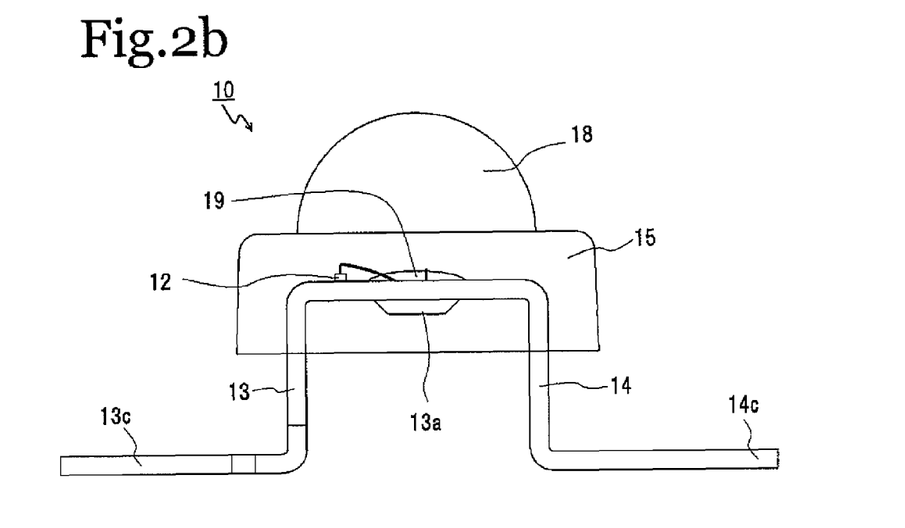

As shown in FIG. 1 and FIGS. 2A and 2B, the light emitting device 10 in this Example is a snap mounting-type light emitting device, in which a light emitting element 11, a protective element 12, and parts of a first metal member 13 and a second metal member 14 are integrally sealed in a package 15 made of an epoxy resin.

The light emitting element 11 is produced by laminating, in the following order, on a sapphire substrate an n-type contact layer composed of n-type GaN, an n-type cladding layer composed of n-type AlGaN, a light emitting layer composed of a nitride semiconductor such as InN, AlN, GaN, InGaN, AlGaN, or InGaAlN, a p-type cladding layer composed of p-type AlGaN or InGaN, and a p-type contact layer composed of p-type GaN, and are respectively formed from an InGaN-based semiconductor that emits blue light whose main wavelength is approximately 470 nm.

For the light emitting element, for instance, silver paste or an epoxy resin is used for the die bonding of the light emitting element 11. The electrodes (not shown) provided to the light emitting element 11 and the first metal member 13 is connected by wires composed of gold and having a diameter of 30 μm.

As shown in FIG. 1 and FIGS. 2A and 2B, the first and second metal members 13 and 14 are bent at approximately 90° within the package so that their ends protrude from the bottom face of the package 15, and are then further bent approximately 90° to the outside of the light emitting device, so that they function as external terminals. These first and second metal members 13 and 14 are formed, for example, by punching out silver-plated copper sheeting in a thickness of 0.4 mm using a press. The width Ws of the first and second metal members 13 and 14 at the package side face is about 1.4 mm, and the width Wb at the distal ends is about 6 mm.

The first metal member 13 is equipped with a concave portion 13a and a plane face 13b, as seen in the plan view of FIG. 2A. The concave portion 13a has a diameter of about 1.2 mm, and the width of the plane face 13b is about 0.8 mm at the portion facing the second metal member 14. A depression 16 is formed in the plane face 13b.

The first metal member 13 carries a zener diode (as the protective element 12) on the plane face 13b to the side of the concave portion 13a.

Furthermore, a translucent covering material 19 made of a silicon resin containing a fluorescent substance (such as YAG:Ce) and a diffuser (such as titanium oxide) is embedded by potting from the concave portion 13a to part of the plane face 13b of the first metal member 13. This translucent covering material 19 is either in a form in which it is heaped up in front of the depression 16, or part of its end is absorbed in the depression 16.

Also, a lens 18 for converging the light from the light emitting element 11 is provided above the concave portion 13a and in the middle of the top face of the package 15.

With the light emitting device of the present invention, a depression effectively dams and prevents the out-flow of the translucent covering material that covers/embeds the periphery of a light emitting element, so the translucent covering material can be prevented from spreading and flowing out. Thus, the translucent covering material can be prevented from running down from the metal member. This allows the translucent covering material to be reliably disposed in the proper location, keeps quality variance to a minimum, and allows a light emitting device of high quality to be obtained at a high yield.

Examples 2 to 8

FIGS. 3A to 3G show the light emitting devices of these Examples. These light emitting devices have substantially the same constitution as the light emitting device in Example 1, except that they have a different shape of the depression that determines the region where the translucent covering material is formed.

Figure 3A:
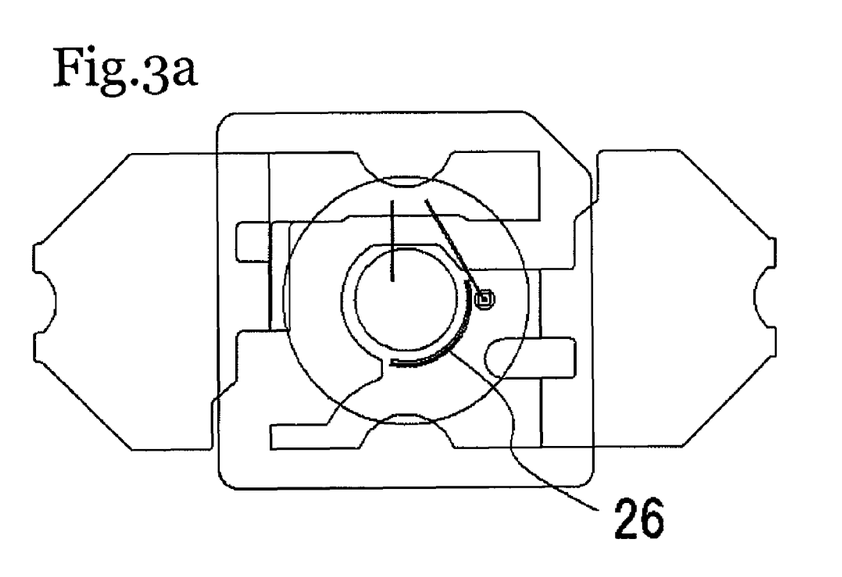
FIGS. 3a to 3g are plan views of other embodiments of the light emitting devices of the present invention.

With the light emitting device shown in FIG. 3A, a depression 26 has the same arc shape as the concave portion, and conforms to the shape of the concave portion.

Figure 3B:
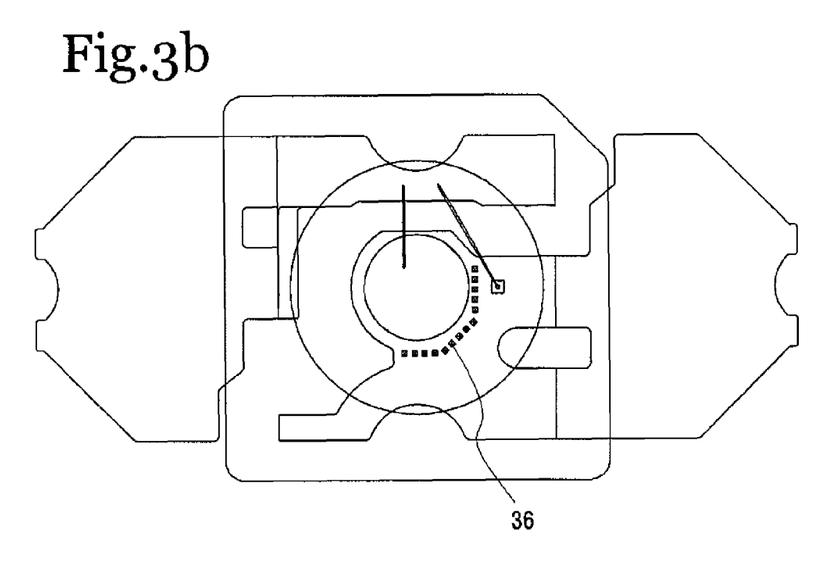

With the light emitting device shown in FIG. 3B, a depression 36 is disposed in a broken line shape so as to correspond to the shape of the concave portion.

Figure 3C:
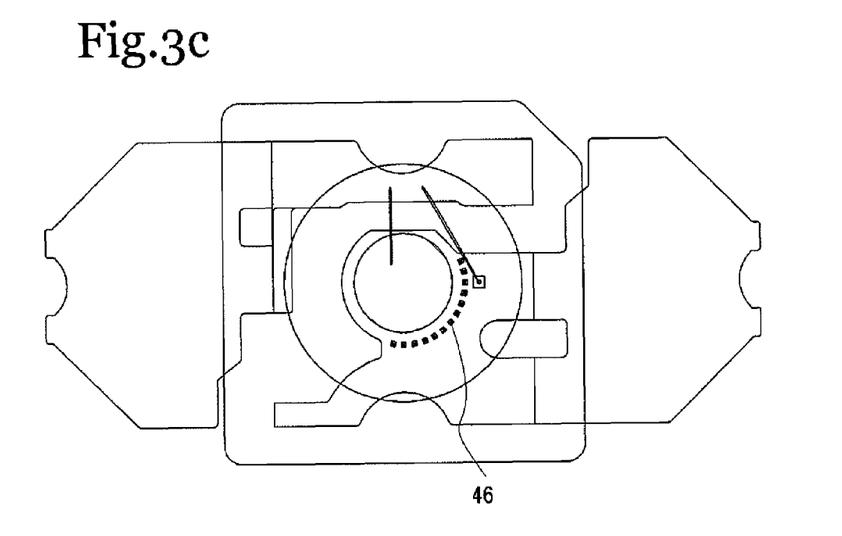

With the light emitting device shown in FIG. 3C, a depression 46 is disposed in a broken line shape that is arced the same as the concave portion, and conforms to the shape of the concave portion.

Figure 3D:
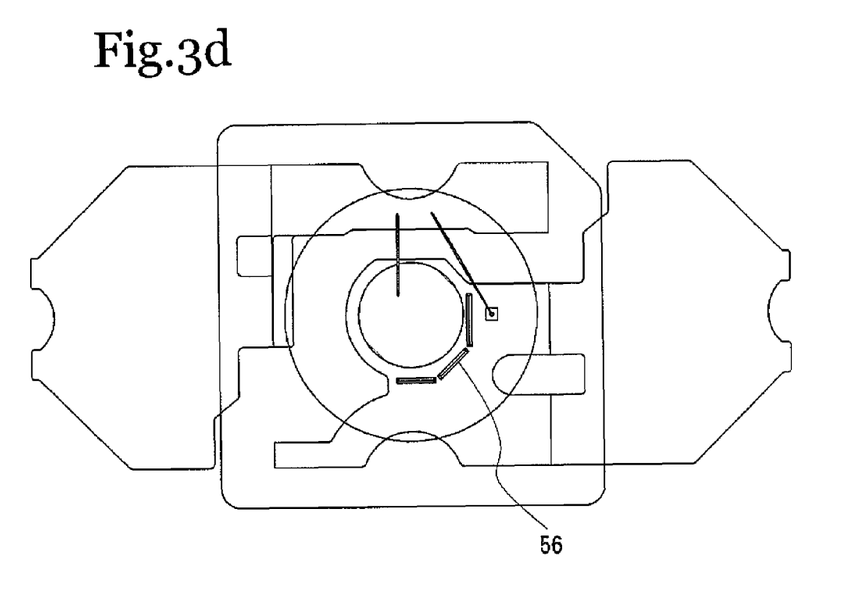

With the light emitting device shown in FIG. 3D, three straight depressions 56 are disposed around the periphery of the concave portion so as to correspond to the shape of the concave portion.

Figure 3E:
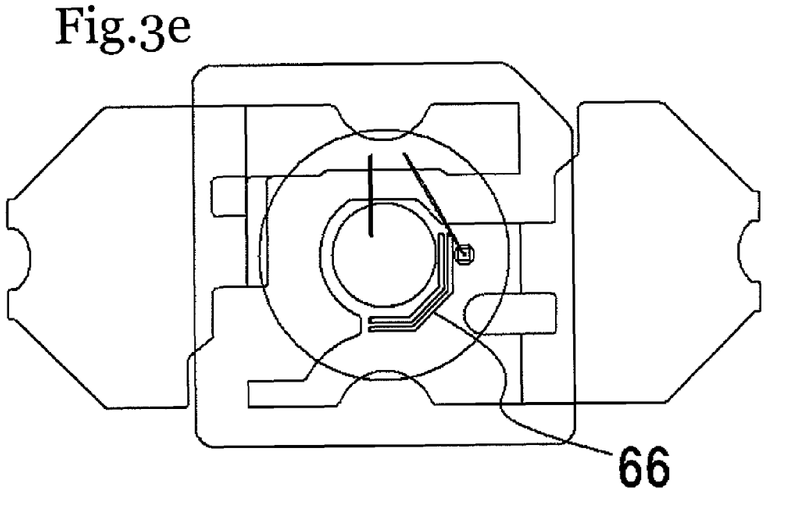

With the light emitting device shown in FIG. 3E, a depression 66 comprises a double row of the depression corresponding to Example 1.

Figure 3F:
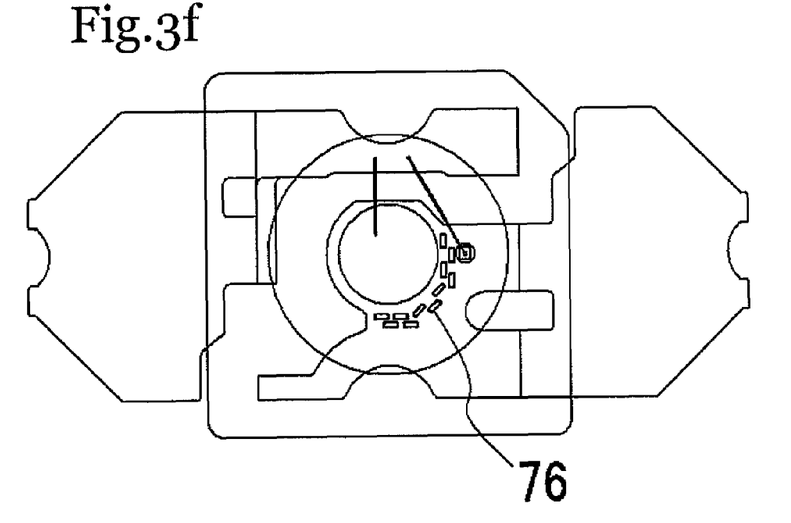

With the light emitting device shown in FIG. 3F, a plurality of depressions 76 are disposed so as to correspond to the shape of the concave portion.

Figure 3G:
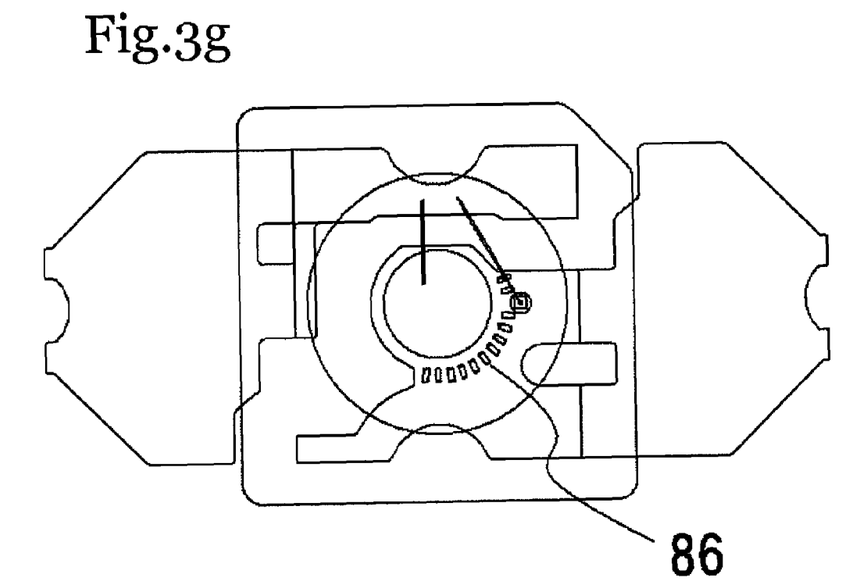

With the light emitting device shown in FIG. 3g, a plurality of depressions 86 are disposed in the same arc shape as the concave portion, and conform to the shape of the concave portion.

All of the light emitting devices having these depressions are similar to the light emitting device in Example 1 in that the region where the translucent covering material is formed can be reliably demarcated, and the translucent covering material can be prevented from spreading and flowing out. As a result, this keeps quality variance to a minimum, and allows a light emitting device of high quality to be obtained at a high yield.

Example 9

Figure 3H:
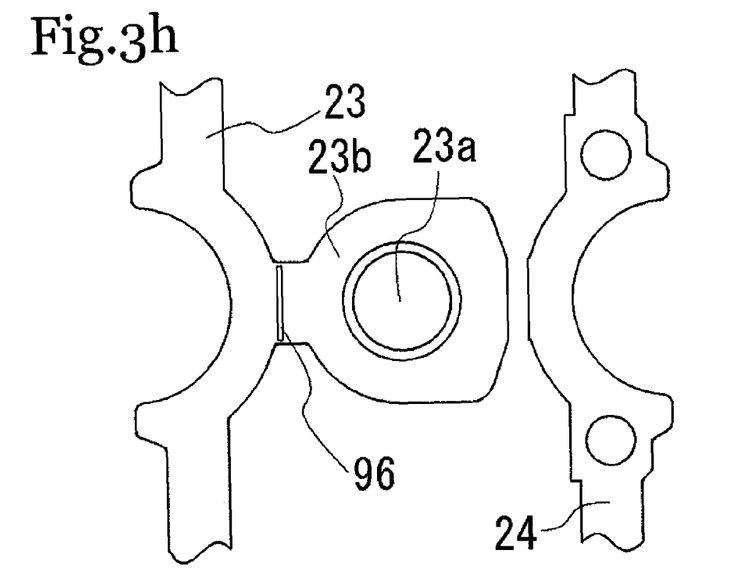
FIG. 3h is a plan view of other embodiment of the metal member of the light emitting devices of the present invention.

FIG. 3H shows the light emitting device of this Example. This light emitting devices have substantially the same constitution as the light emitting device in Example 1, except that they have a slightly different shape of a first metal member 23, and have a different shape and position of the depression that determines the region where the translucent covering material is formed.

That is, the light emitting device shown in FIG. 3H has the first metal member 23 which is equipped with a concave portion 23a and a plane face 23b. The concave portion 23a carries a light emitting element therein, and the plane face 23b encompasses the concave portion 23a and is formed so that the width of the plane face 23b becomes large gradually at the side opposite a second metal member 24 as it approaches the second metal member 24. A translucent covering material (not shown) is embedded in the concave portion 13*a*. A depression 96 is formed in the plane face 23*b* so as to be opposed to the concave portion 23*a* and to be positioned at some distance from the concave portion 23*a*.

The light emitting device of this Example is also similar to the light emitting device in Example 1 in that the region where the translucent covering material is formed can be reliably demarcated, and the translucent covering material can be prevented from spreading and flowing out. As a result, this keeps quality variance to a minimum, and allows a light emitting device of high quality to be obtained at a high yield.

This application claims priority to Japanese Patent Application Nos. 2006-244839 and 2007-158163. The entire disclosure of Japanese Patent Application Nos. 2006-244839 and 2007-158163 are hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A light emitting device comprising:
a first metal member having a concaved portion at one end;
a light emitting element housed within the concaved portion of the first metal member; and
a translucent covering material that covers at least the light emitting element with an outer end of the translucent covering material being disposed inwardly of an outer end of the first metal member,
the surface of the first metal member further having a depression disposed in a position spaced apart from the concaved portion to determine the region where the translucent covering material is formed, the inner wall of the depression being continuous, and
a part of the outer end of the translucent covering material being disposed in one of a position within the depression and a position between the light emitting element and the depression.

2. The light emitting device according to claim 1, wherein the translucent covering material is disposed over the surface of the first metal member across the inside of the concave portion.

3. The light emitting device according to claim 1, wherein the shape of an edge of the one end of the first metal member in plan view is similar to the shape of the adjacent concave portion, and the depression is disposed along the adjacent concave portion.

4. The light emitting device according to claim 3, wherein a plurality of the depressions are disposed along the adjacent concave portion.

5. The light emitting device according to claim 1, wherein the translucent covering material includes a fluorescent substance.

6. The light emitting device according to claim 1, wherein the first metal member has a protective element mounted at a location opposite the light emitting element, with the depression therebetween.

7. The light emitting device according to claim 1, wherein the depression is disposed on an opposite side from an edge of the one end of the first metal member with respect to the light emitting element.

8. The light emitting device according to claim 1, wherein a peripheral region of the light emitting element includes a first region in which the depression is disposed and a second region that is free of the depression.

9. The light emitting device according to claim 1, wherein the one end of the first metal member has a circular arc shape with the light emitting element being disposed generally at a center of the circular arc shape.

10. The light emitting device according to claim 1, wherein the depression generally has a shape of a polygonal line.

11. The light emitting device according to claim 6, wherein the protective element includes a zener diode.

12. The light emitting device according to claim 1, further comprising
a package that covers and seals the first metal member and the translucent covering material.

13. The light emitting device according to claim 12, wherein
the package includes a lens portion arranged over the light emitting element to converge a light emitted from the light emitting element.

14. A light emitting device comprising:
a first metal member;
a light emitting element mounted at one end of the first metal member;
a translucent covering material that covers at least the light emitting element; and
a package covering the first metal member and the translucent covering material, the package including a lens portion arranged over light emitting element and the translucent covering material,
the surface of the first metal member having a depression disposed in a position spaced apart from the light emitting element to determine the region where the translucent covering material is formed, the inner wall of the depression being continuous, and
an outer end of the translucent covering material being disposed in one of a position within the depression and a position between the light emitting element and the depression.

* * * * *